US010242882B2

United States Patent
Bi et al.

(10) Patent No.: US 10,242,882 B2
(45) Date of Patent: Mar. 26, 2019

(54) CYCLIC ETCH PROCESS TO REMOVE DUMMY GATE OXIDE LAYER FOR FIN FIELD EFFECT TRANSISTOR FABRICATION

(71) Applicant: International Business Machines Corporation, Armonk, NY (US)

(72) Inventors: Zhenxing Bi, Niskayuna, NY (US); Donald F. Canaperi, Bridgewater, CT (US); Thamarai S. Devarajan, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/620,806

(22) Filed: Jun. 12, 2017

(65) Prior Publication Data

US 2018/0358232 A1    Dec. 13, 2018

(51) Int. Cl.
*H01L 29/66* (2006.01)
*H01L 21/311* (2006.01)
*H01L 21/3105* (2006.01)

(52) U.S. Cl.
CPC .. *H01L 21/31116* (2013.01); *H01L 29/66545* (2013.01); *H01L 21/31058* (2013.01); *H01L 21/31105* (2013.01); *H01L 29/66795* (2013.01)

(58) Field of Classification Search
CPC ......... H01L 21/31116; H01L 29/66545; H01L 29/66795; H01L 21/3111; H01L 29/66; H01L 21/31058; H01L 21/31105
See application file for complete search history.

(56) References Cited

U.S. PATENT DOCUMENTS

| | | | |
|---|---|---|---|
| 5,635,668 A | 6/1997 | Barnes et al. |
| 6,107,143 A | 8/2000 | Park et al. |
| 6,849,193 B2 | 2/2005 | Hung et al. |
| 7,572,733 B2 | 8/2009 | Jiang et al. |
| 8,226,840 B2 | 7/2012 | Sinha |
| 8,609,510 B1 | 12/2013 | Banna et al. |
| 8,796,095 B2 | 8/2014 | Lin et al. |
| 8,815,668 B2 | 8/2014 | Basker et al. |
| 8,835,292 B2 | 9/2014 | Chudzik et al. |
| 9,224,840 B2 | 12/2015 | Flachowsky et al. |
| 9,257,529 B2 | 2/2016 | Metz |
| 2007/0155148 A1 | 7/2007 | Kim |

(Continued)

*Primary Examiner* — Thanh T Nguyen
(74) *Attorney, Agent, or Firm* — Vazken Alexanian; Ryan, Mason & Lewis, LLP

(57) ABSTRACT

Methods are provided to implement a cyclic etch process to remove oxide layers for semiconductor device fabrication. For example, a method comprises performing a cyclic etch process to incrementally etch an oxide layer, wherein the cyclic etch process comprises sequentially performing at least two instances of an etch cycle. The etch cycle comprises performing an etch process to partially etch a portion of the oxide layer using an etch chemistry and environment which is configured to etch down the oxide layer at an etch rate of about 25 angstroms/minute or less, and performing a thermal treatment to remove by-products of the etch process. The cyclic etch process can be implemented as part of a replacement metal gate process to remove a dummy gate oxide layer of a dummy gate structure as part of, e.g., a FinFET semiconductor fabrication process flow.

16 Claims, 7 Drawing Sheets

(56) References Cited

U.S. PATENT DOCUMENTS

| | | |
|---|---|---|
| 2011/0061810 A1 | 3/2011 | Ganguly et al. |
| 2014/0308818 A1 | 10/2014 | Wang et al. |
| 2015/0145065 A1 | 5/2015 | Kanakasabapathy et al. |
| 2015/0340491 A1 | 11/2015 | Zang et al. |
| 2016/0236244 A1* | 8/2016 | Takahashi ......... H01L 21/31116 |
| 2016/0254384 A1* | 9/2016 | Huang .............. H01L 29/66977 257/24 |

* cited by examiner

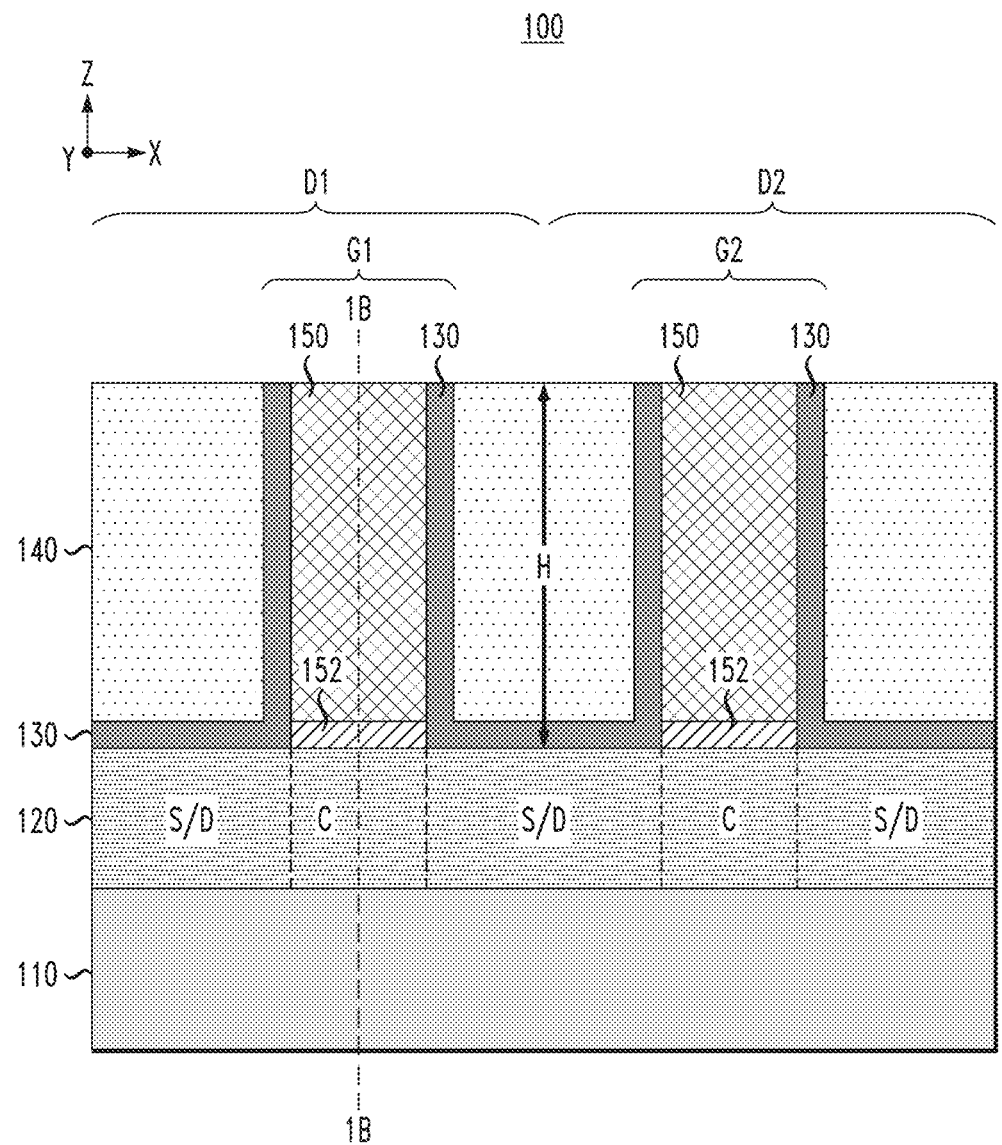

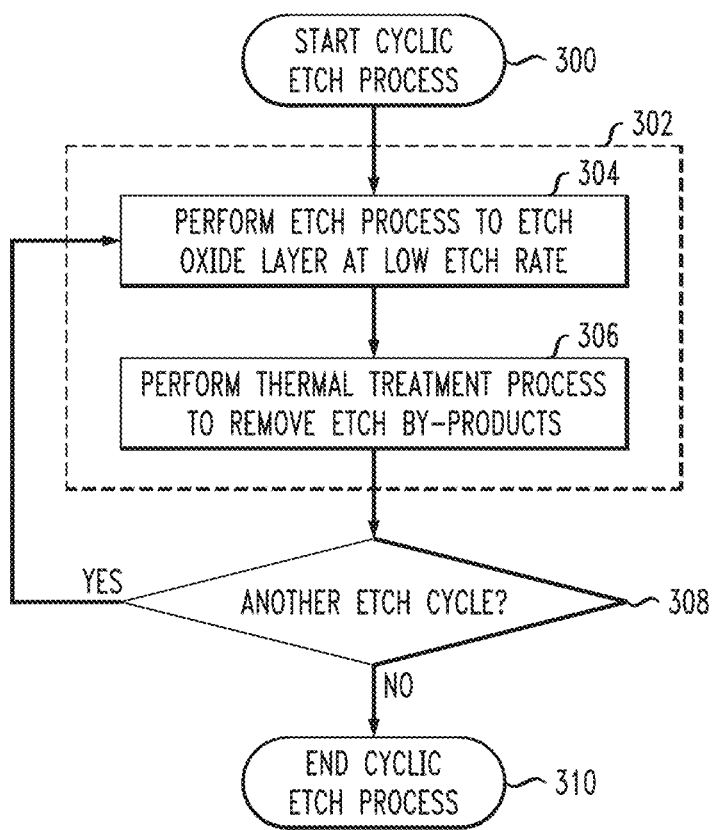

CYCLIC ETCH PROCESS TO REMOVE DUMMY GATE OXIDE LAYER FOR FIN FIELD EFFECT TRANSISTOR FABRICATION

TECHNICAL FIELD

This disclosure generally relates to semiconductor fabrication techniques and, in particular, techniques for fabricating FET (field effect transistor) devices.

BACKGROUND

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin structure formed on a substrate, a gate structure formed over a portion of the vertical semiconductor fin, and source/drain regions formed by portions of the vertical semiconductor fin extending from both sides of the gate structure. The portion of the vertical semiconductor fin that is covered by the gate structure between the source/drain regions comprises a channel region of the FinFET device.

The gate structures of FinFET devices can be formed using various techniques. For example, a FinFET gate structure can be fabricated using a "gate-last" process, which involves, for example, forming a dummy gate structure on a vertical semiconductor fin, fabricating other FinFET device elements (e.g., source/drain regions), and then replacing the dummy gate structure with a metal gate structure. In one conventional process, a dummy gate structure is a sacrificial structure which comprises a dummy gate oxide layer formed on a channel region of the vertical semiconductor fin, and a dummy gate electrode layer formed over the dummy gate oxide layer. The dummy gate structure is subsequently removed and replaced with a metal gate structure using a replacement metal gate (RMG) process.

With RGM, metal gate structures for FinFET devices are formed after other components (e.g., source/drain regions) of the FinFET devices are formed, so that the metal gate structures are not subjected to various potentially damaging processing steps, for example high-temperature anneals, which are performed in previous steps prior to gate replacement. For advanced FinFET technologies, it is important to prevent etch damage to FinFET device structures (e.g., gate spacers, channel region of vertical semiconductor fin structure, ILD (interlayer dielectric layer, etc.) when etching the sacrificial materials to remove the dummy gate structures.

SUMMARY

Embodiments of the invention generally include methods for implementing a cyclic etch process to remove oxide layers for semiconductor device fabrication, and methods for implementing a cyclic etch process to remove dummy gate oxide layers of dummy gate structures as part of a FinFET semiconductor fabrication process flow.

For example, one embodiment includes a method for fabricating a semiconductor device, wherein the method comprises performing a cyclic etch process to incrementally etch an oxide layer, wherein the cyclic etch process comprises sequentially performing at least two instances of an etch cycle. The etch cycle comprises performing an etch process to partially etch a portion of the oxide layer using an etch chemistry and environment which is configured to etch down the oxide layer at an etch rate of about 25 angstroms/minute or less, and performing a thermal treatment to remove by-products of the etch process.

In another embodiment, a method for fabrication an FET device comprises forming a dummy gate structure over a portion of a vertical semiconductor fin of a FinFET device, wherein the dummy gate structure comprises a dummy gate oxide layer formed on vertical semiconductor fin, and a dummy gate electrode layer formed on the dummy gate oxide layer, and performing a RMG (replacement metal gate) process which comprises removing the dummy gate structure, and forming a metallic gate structure in place of the dummy gate structure. The dummy gate structure is removed by etching away the dummy gate electrode layer, and etching away the dummy gate oxide layer using a cyclic etch process to incrementally etch the dummy gate oxide layer, wherein the cyclic etch process comprises sequentially performing at least two instances of an etch cycle. The etch cycle comprises performing an etch process to partially etch a portion of the dummy gate oxide layer using an etch chemistry and environment which is configured to etch down the dummy gate oxide layer at an etch rate of about 25 angstroms/minute or less, and performing a thermal treatment to remove by-products of the etch process.

Other embodiments will be described in the following detailed description of embodiments, which is to be read in conjunction with the accompanying figures.

BRIEF DESCRIPTION OF THE DRAWINGS

FIGS. 1A and 1B are schematic views of a semiconductor device at an intermediate stage of fabrication in which FinFET devices with dummy gate structures are formed on a semiconductor substrate.

FIG. 3 is a flow diagram of a cyclic etch process that is performed to remove dummy gate oxide layers of the dummy gate structures as part of the replacement metal gate process, according to an embodiment of the invention.

DETAILED DESCRIPTION

Figure 1B:
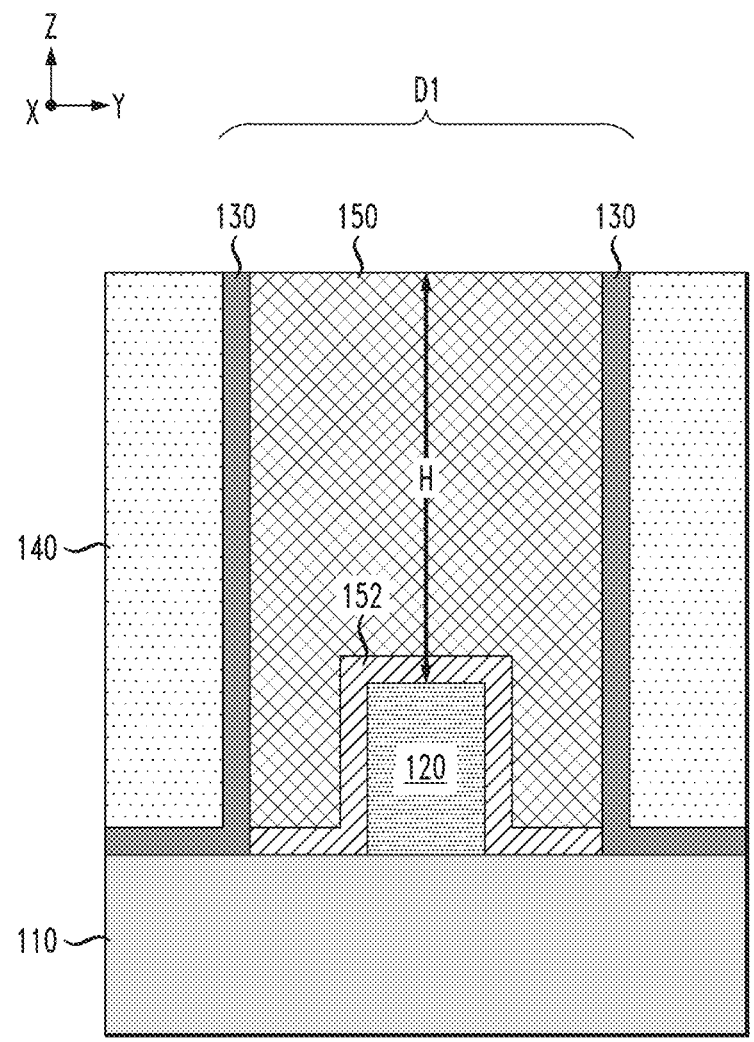

Embodiments will now be described in further detail with regard to methods for implementing a cyclic etch process to remove oxide layers for semiconductor device fabrication. For example, embodiments of the invention include methods for implementing a cyclic etch process as part of a FinFET fabrication flow to remove dummy gate oxide layers of dummy gate structures without damaging other FinFET device structures, such as gate spacers, a channel region of a vertical semiconductor fin structure, an ILD layer, etc., when removing the dummy gate structures.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1A, 1B, 2A, 2B, 3, 4A and 4B illustrate a method for implementing a cyclic etch process to remove a dummy gate oxide layer as part of a process flow for FinFET fabrication. To begin, FIGS. 1A and 1B are schematic views of a semiconductor device 100 at an intermediate stage of fabrication in which FinFET devices D1 and D2 with respective dummy gate structures G1 and G2 are formed on a semiconductor substrate 110. FIG. 1A is a schematic cross-sectional view of the semiconductor device 100 along an X-Z plane, and FIG. 1B is a schematic cross-sectional view (Y-Z plane) of the semiconductor device along line 1B-1B shown in FIG. 1A.

As shown in FIGS. 1A and 1B, the semiconductor device 100 comprises a vertical semiconductor fin 120, insulating spacers 130, and an ILD layer 140. The dummy gate structures G1 and G2 each comprise a dummy gate electrode layer 150 and a dummy gate oxide layer 152, which are formed over respective channel (C) regions of the vertical semiconductor fin 120. The FinFET devices D1 and D2 have respective source/drain (S/D) regions formed on portions of the vertical semiconductor fin 120 which extend from the insulating spacers 130 on the sidewalls of the respective dummy gate structures G1 and G2. In the example shown in FIG. 1A, the FinFET devices D1 and D2 share a common source/drain (S/D) region between the dummy gate structures G1 and G2. The semiconductor device 100 shown in FIGS. 1A and 1B can be fabricated using known semiconductor fabrication techniques and suitable semiconductor materials.

For example, the semiconductor substrate 110 is illustrated as a generic substrate layer, and may comprise various structures and layers of semiconductor material. In one embodiment, the semiconductor substrate 110 comprises a bulk semiconductor substrate (e.g., wafer) formed of, e.g., silicon, or other types of semiconductor substrate materials that are commonly used in bulk semiconductor fabrication processes such as germanium, silicon-germanium alloy, silicon carbide, silicon-germanium carbide alloy, or compound semiconductor materials (e.g. III-V and II-VI). Non-limiting examples of compound semiconductor materials include gallium arsenide, indium arsenide, and indium phosphide. In another embodiment, the semiconductor substrate 110 comprises a SOI (silicon on insulator) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

In addition, the semiconductor substrate 110 may further include shallow trench isolation (STI) regions (not specifically shown) formed in the surface of the semiconductor substrate 110 to define device regions. The STI regions can be formed using a standard technique which involves, e.g., etching a pattern of trenches in the surface of the substrate 110, depositing one or more insulating/dielectric materials (such silicon nitride, or silicon dioxide) to fill the trenches, and then removing the excess insulating/dielectric material using a technique such as etch-back or chemical-mechanical planarization (CMP). The STI regions are formed to define a plurality of isolated device regions in which FinFETs according to embodiments of the invention are formed.

The vertical semiconductor fin 120 can be fabricated using known methods. For example, for bulk and SOI substrate embodiments, the vertical semiconductor fin 120 shown in FIGS. 1A and 1B may be formed by patterning an active silicon layer (e.g., crystalline silicon, crystalline SiGe, III-V compound semiconductor material, etc.) at the surface of the bulk or SOI substrate to form a plurality of vertical semiconductor fins, one of which is shown in FIGS. 1A and 1B for ease of illustration. In one embodiment, the vertical semiconductor fin 120 may be patterned from a crystalline epitaxial SiGe layer that is grown on top of a bulk silicon substrate or a bulk germanium substrate. In other embodiment, the vertical semiconductor fin 120 can be formed by epitaxially growing crystalline semiconductor material on the surface of the semiconductor substrate 110 using ART (aspect ratio trapping) techniques. ART enables selective epitaxy of III-V compound semiconductor material, for example, to fill high aspect ratio trenches formed in an insulating layer, to thereby form high quality active channel layers for FinFET devices. The crystalline SiGe layer (or other types of epitaxial semiconductor layers) can be epitaxially grown using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on silicon substrate layer. A strained-Si/relaxed-SiGe structure produces tensile strain which primarily improves electron mobility for n-type FET devices, while a strained-SiGe/relaxed-Si structure produces a compressive strain which primarily improves hole mobility for p-type FET devices.

Next, the dummy gate structures G1 and G2 can be fabricated using known process flows. For example, the dummy gate structures G1 and G2 can be fabricated by forming a conformal oxide layer over the surface of the semiconductor substrate to cover the vertical semiconductor fin 120 (and other fin structures). The conformal oxide layer can be formed by growing an oxide layer (e.g., silicon oxide) on the exposed surfaces of semiconductor material (e.g., Si or SiGe surfaces, etc.) using known techniques, or by depositing a conformal layer of oxide material (e.g., silicon dioxide) over the surface of the semiconductor substrate using a known process such as atomic layer deposition (ALD), chemical vapor deposition (CVD), etc. A layer of sacrificial silicon material, such as polysilicon or amorphous silicon, is then blanket deposited over the semiconductor substrate and then planarized. The layer of sacrificial silicon material can be deposited using known methods such as CVD, physical vapor deposition (PVD), electro-chemical deposition, and other suitable deposition methods. The layer of sacrificial silicon material can be planarized using CMP.

The conformal oxide layer and sacrificial silicon layer are then patterned to form the dummy gate structures G1 and G2. For example, the sacrificial silicon layer is patterned using a photolithographic process to form an etch mask, followed by a dry etch process (e.g., reactive ion etch (RIE) process) to etch portions of the sacrificial silicon layer exposed through the etch mask, to thereby form the dummy gate electrode layers 150 of the dummy gate structures G1 and G2. With this process, the underlying oxide layer serves as an etch buffer layer when etching the sacrificial silicon layer. For example, a poly etch process is performed selective to the oxide material, so that the oxide layer serves as an etch stop and buffer layer to prevent the poly etch process from etching through the oxide layer and damaging the semiconductor material of the vertical semiconductor fin 120.

Next, the exposed portions of the underlying oxide layer are etched to form the dummy gate oxide layers 152 of the dummy gate structures 150. For example, the exposed portions of the underlying oxide layer are etched using suitable etch process and using the patterned dummy gate electrode layers 150 as an etch mask. The oxide layer can be etched selective to the materials of the underlying vertical semiconductor fin 120 and the dummy gate electrode layers 150 to prevent or minimize etching of such materials.

After forming the dummy gate structures G1 and G2, the fabrication process continues with forming the S/D regions on the exposed portions of the vertical semiconductor fin 120, forming the insulating layer 130, and forming the ILD layer 140. As shown in FIG. 1A, the S/D regions are formed on areas of the vertical semiconductor fin 120 adjacent to the dummy gate structures G1 and G2. The S/D regions can be formed by forming a silicide on the exposed surfaces of the vertical semiconductor fin 120, or forming an epitaxial semiconductor layer on the exposed surfaces of the vertical semiconductor fin 120 using known methods.

The insulating layer 130 is fabricated using known materials and known techniques. For example, the insulating layer 130 may comprise one or more layers of dielectric material such as silicon nitride (SiN), SiBCN, SiOCN, or some other type of low-k dielectric material that is commonly used to form insulating spacers for FinFET devices. In one example process, the insulating layer 130 can be formed, in part, by depositing and patterning a layer of dielectric material (e.g., SiBCN) to encapsulate the dummy gate structures G1 and G2 in dielectric material (e.g., for gate sidewall spacers), and to expose the portions of the vertical semiconductor fin 120 on which the S/D regions are formed. After forming the S/D regions, a conformal layer of dielectric material (which may form an upper layer the insulating layer 130) is deposited to cover the S/D regions.

Following formation of the S/D regions and the insulating layer 130, the ILD layer 140 is formed by depositing one or more layers of insulating material over the surface of the semiconductor substrate to cover the dummy gate structures G1 and G2, and then planarizing the surface of the semiconductor substrate down to a level which exposes the upper surface of the dummy gate electrode layers 150, as shown in FIGS. 1A and 1B. The ILD layer 140 can be formed using any suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 140 may comprises a single deposited layer of insulating material, or multiple layers of insulating material (e.g., a first layer of a flowable oxide and a second layer of insulating material formed on the first layer). The ILD layer 140 may be deposited using known deposition techniques, such as, for example, ALD, CVD, PECVD (plasma-enhanced CVD), or PVD, or spin-on deposition.

A next phase of the semiconductor fabrication process comprises performing a replacement metal gate process using methods as will be discussed now in further detail with reference to FIGS. 2A, 2B, 3, 4A and 4B. In general, the replacement metal gate process comprises removing the dummy gate structures G1 and G2, and then forming conductive gate structures such as metallic gate structures. As shown in FIGS. 1A and 1B, the surface of the semiconductor structure is planarized down to a level with defines a gate height (H) for the FinFET devices D1 and D2. In one embodiment of the invention, a dummy gate removal process is implemented to remove the dummy gate structures G1 and G2 while preserving the gate height (H) and minimizing or preventing etching of the channel regions (C) of the vertical semiconductor fin 120. In one embodiment, a dummy gate removal process implements a cyclic etch process to remove the dummy gate oxide layers 152 using an etch chemistry and process flow which allows the material of the dummy gate oxide layers 152 to be etched highly selective to the materials that form the vertical semiconductor fin 120, the insulating layer 130, and the ILD layer 140.

Figure 2A:
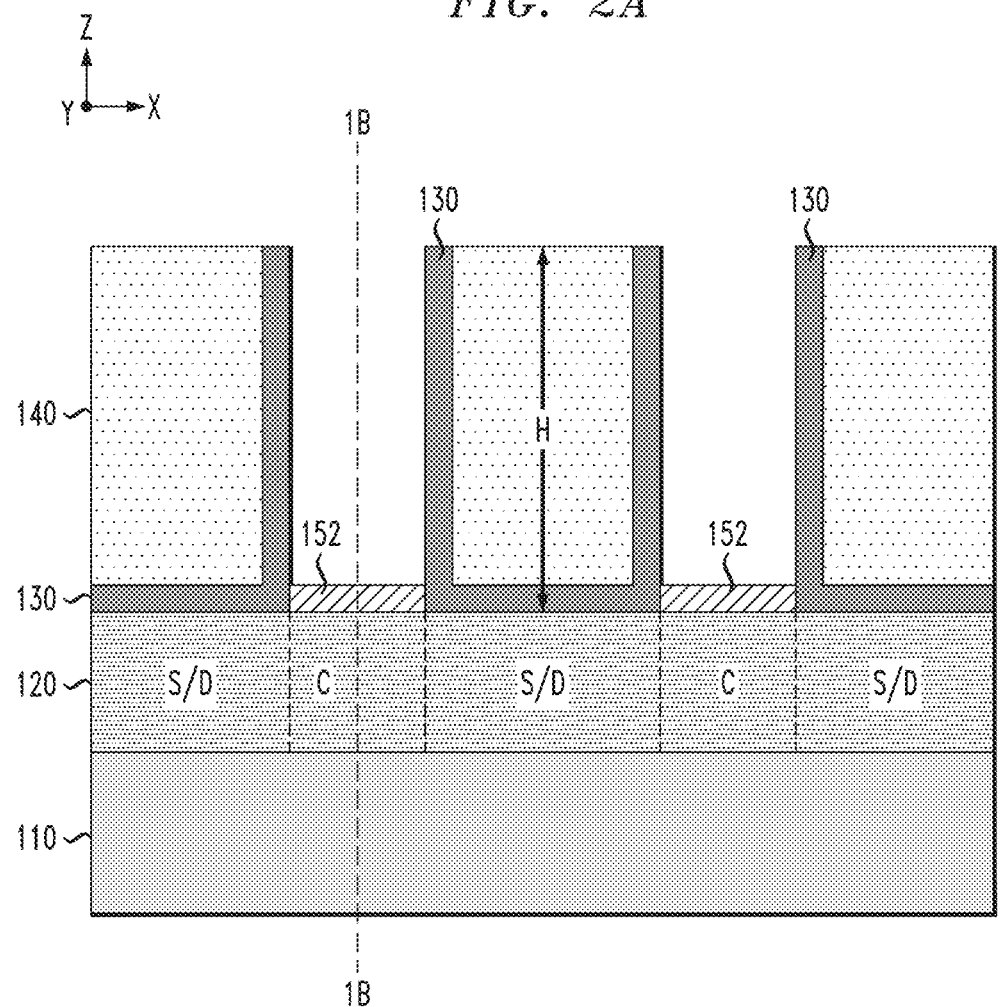
FIGS. 2A and 2B are schematic views of the semiconductor device of FIGS. 1A and 1B, respectively, after removing dummy gate electrode layers of the dummy gate structures as part of a replacement metal gate process.
Figure 2B:
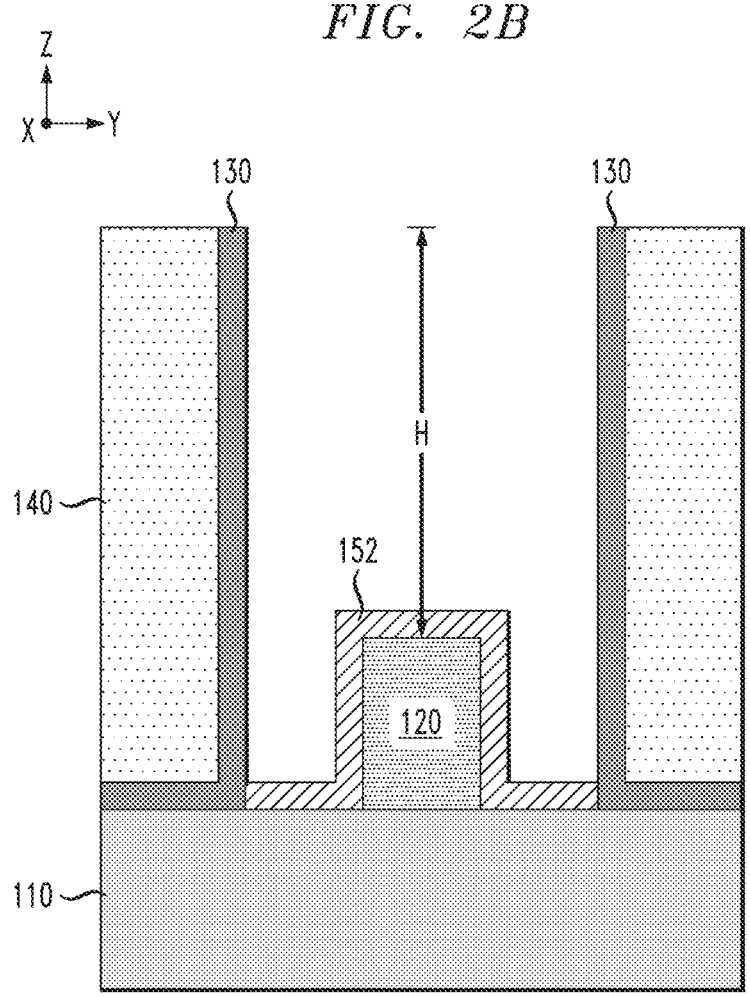

For example, FIGS. 2A and 2B are schematic views of the semiconductor device of FIGS. 1A and 1B, respectively, after removing the dummy gate electrode layers 150 of the dummy gate structures G1 and G2. The dummy gate electrode layers 150 can be removed using a wet etch process (e.g., TetraMethyl Ammonium Hydroxide (TMAH) chemical etch solution), or a dry etch process (e.g., $NF_3+H_2$ gas phase chemical etch) to etch away the sacrificial silicon material of the dummy gate structures G1 and G2 selective to the dielectric and insulating materials of the surrounding layers and features (e.g., 130, 140, and 152). This etch process exposes the dummy gate oxide layers 152 of the dummy gate structures G1 and G2. The dummy gate oxide layers 152 are then removed using a cyclic etch process, as shown in FIG. 3.

In particular, FIG. 3. is a flow diagram of a cyclic etch process that is performed to remove the dummy gate oxide layers 152 of the dummy gate structures G1 and G2, according to an embodiment of the invention. The cyclic etch process is commenced (300) following removal of the dummy gate electrode layers 150. In one embodiment, the cyclic etch process comprises performing two or more instances of an etch cycle (302) to incrementally etch down the oxide layers 152 until the channel regions C of the vertical semiconductor fin 120 are exposed. As shown in the example embodiment of FIG. 3, the etch cycle (302) comprises an etch process (304) to partially etch down a portion of each oxide layer 152, followed by a thermal treatment (306) to remove by-products of the etch process for the given etch cycle.

In one embodiment, the etch process (304) is performed using an etch chemistry and etch environment in which the oxide layers 152 are etched at a relatively low etch rate, and wherein the oxide material is etched highly selective to the materials of the vertical semiconductor fin 120, the insulating layer 130, and the ILD layer 140. For example, in one embodiment of the invention, the etch process (304) is performed to etch down the oxide layers 152 at an etch rate of about 25 angstroms (Å)/min or less (which is significantly lower than conventional single-step oxide etch process flows which are performed at oxide etch rates of 120 Å/min or more). As explained in further detail below, a target etch rate of 25 Å/min or less can be obtained by using a diluted reaction gas at an optimized chamber pressure.

The thermal treatment (306) process is performed to remove a layer of etch by-products which is formed as a result of the oxide etch process, and which inhibits or otherwise prevents the reaction gases from diffusing through the by-product layer to reach the target oxide layers. The implementation of a thermal treatment between oxide etch cycles to remove the by-product layer enables the use of diluted reaction gases to etch the oxide layers at a slow etch rate at 25 Å/min or less. In this regard, the etch cycle (302) provides a balance between the amount of etch by-products that are formed and the ability of the etch chemistry to diffuse through the etch by-product layer and reach the oxide layer.

In addition, the process time of the etch process (304) is selected based on factors including, but not limited to, a "saturation time" of the oxide etch process and an "incubation period" of the materials that are subjected to the etch chemistry during the etch process. The "saturation time" of the oxide process refers to the period of process time at which the given etch chemistry for the oxide etch can no longer effectively etch the oxide layers. The saturation time of the oxide etch process will vary depending on the etch chemistry and etch environment, etc. The "incubation period" for etching a given material refers to the period of time that elapses between the start of the etch process and the time when the given material starts to be etched by the given etch chemistry. For example, for a given etch process (304), the etching of the oxide material of the dummy gate oxide layers 152 may begin at 1 second after the start of the etch process, while the etching of the nitride material of the insulating layer 130 (e.g., gate sidewall spacers) may begin at 10 seconds after the start of the etch process. In this regard, assuming that the incubation period for etching the oxide material of the dummy gate oxide layers 152 is less than the incubation periods for etching the materials of the vertical semiconductor fin 120, the insulating layer 130, and the ILD layer 140, the process time of each oxide etch process (304) (performed in multiple etch cycles (320)) can be set below or slightly more than the incubation periods of such materials to prevent or otherwise minimize etching of the vertical semiconductor fin 120, the insulating layer 130, and the ILD layer 140 over the entirety of the cyclic etch process.

The etch cycle (302) is repeated multiple times (308) to incrementally etch away the dummy gate oxide layers 152 until the channel regions C of the vertical semiconductor fin 120 are exposed, in which case no further etch cycle is performed (308), and the cyclic etch process is ended (310). The number of times in which the etch cycle (302) is performed to remove the dummy gate oxide layers 152 will vary depending on factors including, but not limited to, the thickness of the dummy gate oxide layers 152, and the amount of oxide material that is etched away in each cycle for a given combination of (i) process time, (ii) etch chemistry, and (iii) etch environment, wherein the given combination is optimized to prevent or otherwise minimize etching of the vertical semiconductor fin 120, the insulating layer 130, and the ILD layer 140.

For example, the dummy gate oxide layers 152 are typically formed with a thickness in range of 20 Å to 50 Å. Assume that the etch chemistry and etch environment of the etch process (304) is configured to etch the oxide layers 152 at an etch rate of 20 Å/min, and that the dummy gate oxide layers 152 to be removed have a thickness of 20 Å. In one example embodiment, the 20 Å thick oxide layers 152 can be removed using a cyclic etch process in which the etch cycle (302) is sequentially performed three times, with a process time of 20 seconds for the etch process (304) in each etch cycle (302). Assume further that the incubation periods of the other materials (which form the structures 120, 130, and 140) are all 10 seconds or more for the given etch chemistry and etch environment of the etch process (304). In this instance, the other materials (which form the structures 120, 130, and 140) will be etched for no more than 10 seconds in each of the three etch cycles, for a total of no more than 30 seconds over the complete cyclic etch process.

On the other hand, if only a single oxide etch process was performed to remove the 20 Å thick oxide layer at an etch rate of 20 Å/min, it would take about one minute of process time to remove the oxide layer. In this instance, assuming again that the incubation periods of the other materials which form the structures 120, 130, and 140 are all 10 seconds or more for the given etch chemistry and etch environment of the single etch process, the other materials could possibly be etched for a period of 50 seconds over the one minute process time of the single etch process (which is much greater than the 30 seconds achieved using the example cyclic etch process discussed above). This example conceptually illustrates one way in which a cyclic etch process according to an embodiment of the invention can be implemented to prevent or otherwise minimize etching of the vertical semiconductor fin 120, the insulating layer 130, and/or the ILD layer 140 over the entirety of the cyclic etch process.

In another example embodiment, the process time for each oxide etch process (304) can be set to less than the incubation period of one or more of the vertical semiconductor fin 120, the insulating layer 130, and/or the ILD layer 140 to prevent etching of such structures/layers over the entire cyclic etch process. For example, assume again that the etch chemistry and etch environment of the etch process (304) is configured to etch the oxide layers 152 at an etch rate of 20 Å/min, that the dummy gate oxide layers 152 are formed with an initial thickness of 20 Å, and that the incubation period for each of the structures/layers 120, 130, 140 is no less than 10 seconds for the given etch chemistry and etch environment of the etch process (304). In this instance, the 20 Å thick oxide layers 152 can be removed using a cyclic etch process in which the etch cycle (302) is sequentially performed six times, with a process time of 10 seconds for the etch process (304) in each etch cycle (302).

Since the process time (10 seconds) for each etch process (304) is no greater than the incubation periods (10 seconds or more) of the materials that form the structures/layers 120, 130, and 140, this example conceptually illustrates one way in which a cyclic etch process according to an embodiment of the invention can be implemented to prevent etching of the vertical semiconductor fin 120, the insulating layer 130, and/or the ILD layer 140 over the entirety of the cyclic etch process to remove the dummy gate oxide layers 152. In other words, the amount of etching of the structures/layers 120, 130, and 140 can be decreased and/or prevented by increasing the number of etch cycles coupled with reducing the process time for each oxide etch process that is performed to remove the dummy gate oxide layers 152.

In any event, one of ordinary skill in the art will appreciate that a cyclic etch process according to an embodiment of the invention can be tailored for a given application by modifying various process parameters (e.g., number of oxide etch cycles, process time of oxide etch process, oxide etch rates, etch chemistry, etc.) to remove the dummy gate oxide layers 152 while preventing or minimizing the etching of one or more of the surrounding structures/layers 120, 130, and 140 within an acceptable tolerance. For example, as noted above, it is desirable to implement a cyclic etch process to remove the dummy gate oxide layers 152, wherein the cyclic etch process is configured to minimize or avoid the etching of the ILD layer 140 to preserve a target gate height H during the oxide etching. Moreover, it is desirable to limit or prevent the etching of the semiconductor material in the channel regions C of the vertical semiconductor fin 120. In one embodiment of the invention, a cyclic etch process can be implemented based on various process parameters as illustrated in the following table.

| CYCLIC ETCH PROCESS PARAMETERS | |
|---|---|
| Etch Process Time | up to 100 seconds |
| # Process Cycles | Two or More |
| Chamber Pressure | 30-50 mTorr |
| Carrier Gas (e.g., $N_2$) Flow Rate | 100-200 sccm |
| Carrier Gas (e.g. Ar) Flow Rate | 400-1000 sccm |
| Reaction Gas (e.g. HF) Flow Rate | 30-50 sccm |
| Reaction Gas (e.g. $NH_3$) Flow Rate | 30-50 sccm |
| Etch Temperature | 30-50° C. |
| Thermal Anneal Process Time | 1-5 min |
| Thermal Anneal Temperature | 150-200° C. |
| Thermal Anneal Pressure | 1000 mTorr |
| Thermal Anneal Gas (e.g., $N_2$) Flow Rate | 1000-2000 sccm |

The oxide etch process parameters (e.g., etch process time, # cycles, chamber pressure, carrier gases, reaction gases, flow rates of the carrier and reaction gates, etch temperature, etc.) shown in the above table provide exemplary parameters which can be utilized/adjusted to tailor an oxide etch process (in block 304, FIG. 3) that is configured to provide an oxide etch rate of about 25 (Å)/min or less, as well as provide an oxide etch chemistry which is highly selective to the dielectric materials that form the insulating layer 130 (e.g., gate sidewall spacer) and the ILD layer 140, and the semiconductor material (e.g., crystalline Si or SiGe) which forms the vertical semiconductor fin 120. In addition, the thermal anneal treatment process parameters (e.g., thermal anneal process time, and thermal anneal temperature, pressure, and reaction gas) shown in the above table provide example parameters which can be implemented to perform a thermal treatment (in block 306, FIG. 3) to remove etch by-products that are generated from an oxide etch.

For example, in one embodiment of the invention, an oxide etch process (304) can be performed by flowing a mixture of $NH_3$ (Ammonia) and HF (Hydrogen Fluoride) reaction gases (or etchant gases) into a process chamber at a flow rate (sccm (standard cubic centimeter per minute)) of about 30 sccm to about 50 sccm. The reaction gases are diluted using a carrier gas, such as Ar (Argon) or $N_2$ (nitrogen), or mixtures thereof, wherein the carrier gas is introduced into the process chamber at a flow rate of about 400 sccm to about 1000 sccm. In one embodiment of the invention, the ratio of the carrier gas to reaction gas (e.g. Ar:HF) is about 20:1 or greater. Furthermore, the operating pressure within the process chamber is maintained in a range of about 30 mTorr to about 50 mTorr, and the etch temperature maintained in a range of about 30° C. to about 50° C. As noted above, under these etch conditions in which the reaction gases are significantly diluted, and where the etch process is performed at an optimal chamber pressure, a relatively low etch rate of 25 Å/min or less is achieved to etch the oxide layer.

For example, assuming the oxide layer being etched comprises silicon dioxide ($SiO_2$), the etchant gases $NH_3$ and HF are absorbed on the wafer surface and react with the oxide material on the surface of the $SiO_2$ layer to form water vapor ($H_2O$) and an etch by-product layer comprising a thin film of Ammonium Hexafluorosilicate (($NH_4)_2SiF_6$) on the surface of the oxide layer. As noted above, the process time of the etch process is optimized so that the etchant gases can diffuse through the etch by-product layer and reach the underlying oxide material prior, e.g., to the etch saturation time.

Following the etch process, the remaining vapors (e.g., $H_2O$ vapor) are removed from the process chamber using a vacuum pump, for example, leaving behind a thin etch by-product layer of $(NH_4)_2SiF_6$ on the substrate surface. The etch by-product layer is then removed using a thermal treatment process (306) as discussed above. In one embodiment, the thermal treatment (306) is performed by a thermal anneal process which comprises heating the process chamber (or an alternative dedicated anneal chamber) to a target anneal temperature in a range of about 150° C. to about 200° C., and flowing an anneal gas, such as nitrogen ($N_2$) into the process chamber (or an alternative dedicated anneal chamber) at a flow rate of about 1000 sccm to about 2000 sccm, while maintaining the chamber pressure at about 1000 mTorr. The anneal process can be performed for period of time (e.g., 1-5 minutes) which is sufficient to evaporate the etch by-product layer on the substrate surface.

Experimental results have shown that a cyclic etch process for etching an oxide layer (e.g., dummy gate oxide layer) according to an embodiment of the invention provides significant benefits over conventional oxide etch methods. For example, an oxide etch process is configured to provide a relatively low oxide etch rate (25 Å/min or less) which prevents over etching of other device features such vertical semiconductor fins formed of epitaxial semiconductor material such as crystalline Si or SiGe. Moreover, the oxide etch process parameters discussed above provide a shorter chamber stabilizing etch time, which allows an oxide layer to be etched at a minimum etch amount of less than 10 Å in a given cycle, as opposed to conventional oxide etch methods which have longer chamber stabilizing etch times and which provide a minimum etch amount of 20 Å or greater for a given etch process.

In addition, experimental results have shown that a cyclic etch process according to an embodiment of the invention provides a much lower loss of epitaxial material of the vertical semiconductor fins when removing dummy gate oxide layers, as compared to conventional methods. For example, experimental results have shown that oxide layers are etched highly selective to epitaxial Si and epitaxial SiGe materials of vertical semiconductor fins. In particular, a cyclic etch process provides an etch selectivity between an oxide material and epitaxial Si material (oxide:Si) of 150:1 and greater. Further, a cyclic etch process provides an etch selectivity between an oxide material and epitaxial SiGe material (oxide:SiGe) of 25:1 and greater, with a percentage of Ge material up to 40%. The improved etch selectivity is a result of the use of a cyclic oxide etch process, and an extended incubation period for the epitaxial material, which is obtained using etch chemistries and environments as discussed herein, as compared to conventional methods. The reduced loss of semiconductor material in the channel regions C of the vertical semiconductor fin also leads to better carrier mobility of FinFET devices formed with high-k metal gate structures.

In addition, experimental results have shown that a cyclic etch process according to an embodiment of the invention provides an etch selectivity between an oxide material and a low-k spacer material (e.g., SiBCN) of 100:1 and greater, which is about 3× or greater than the etch selectivity that is achieved using conventional methods. This allows, for example, the dummy gate oxide layer 152 (shown in FIGS. 2A and 2B) to be removed highly selective to the insulating layer 130 that forms the gate sidewall spacers. The highly selective oxide etch process allows for a wide range of other types of spacer materials to be used other than SiBCN and SiN, for example, for fabricating gate structures of FinFET devices.

Experimental results have further shown that a cyclic etch process according to an embodiment of the invention provides a higher etch selectivity (e.g., about 2:1) between an oxide material of a dummy gate oxide layer, and an oxide material that form an ILD layer (e.g., dummy gate oxide: ILD oxide), providing around 50% or more less loss of the ILD material, as compared to conventional dummy gate oxide etch methods. This greater etch selectivity results in better perseveration of the gate height H as shown in FIGS. 2A and 2B.

Figure 4A:
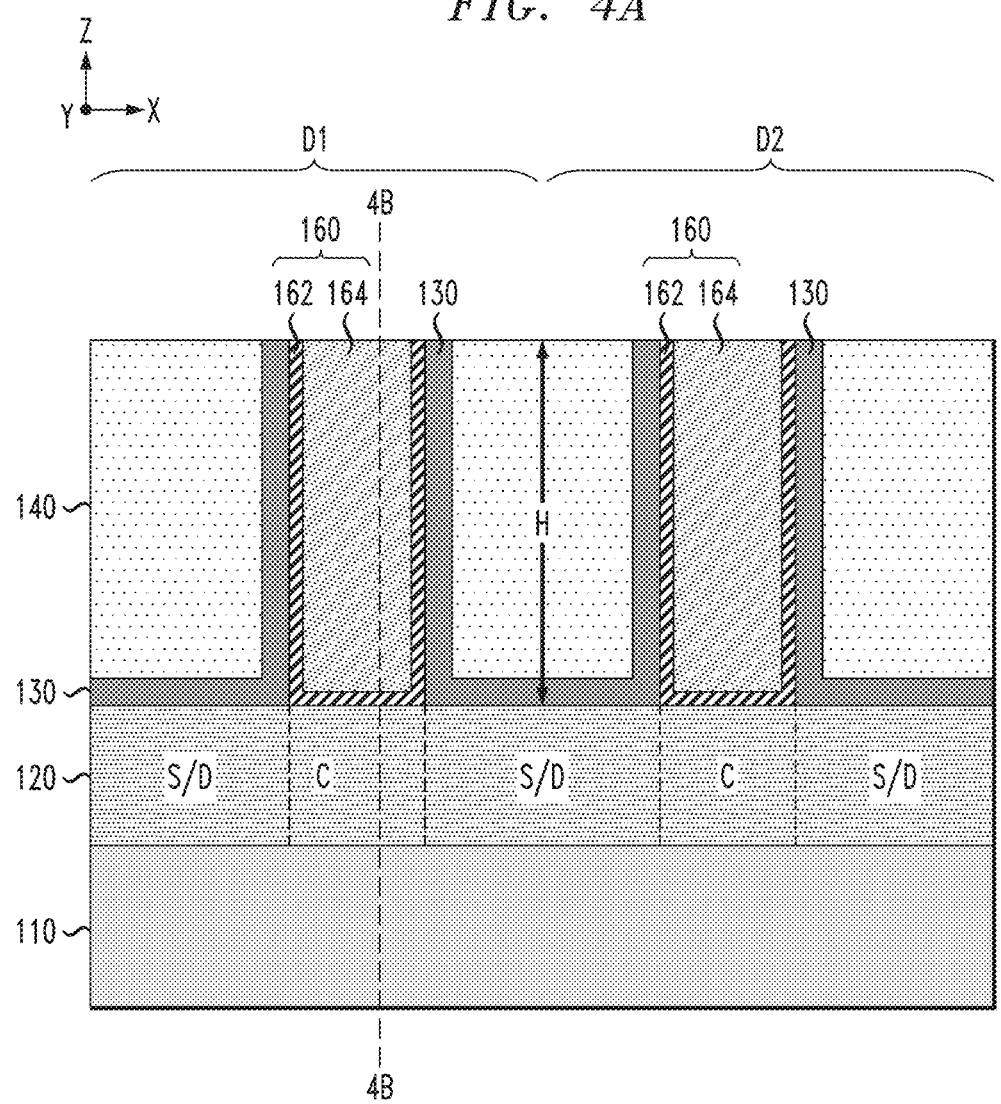
FIGS. 4A and 4B are schematic views of the semiconductor device of FIGS. 2A and 2B, respectively, after removing the dummy gate oxide layers, and forming a high-K metal gate structure for the FinFET devices to complete the replacement metal gate process, according to an embodiment of the invention.
Figure 4B:
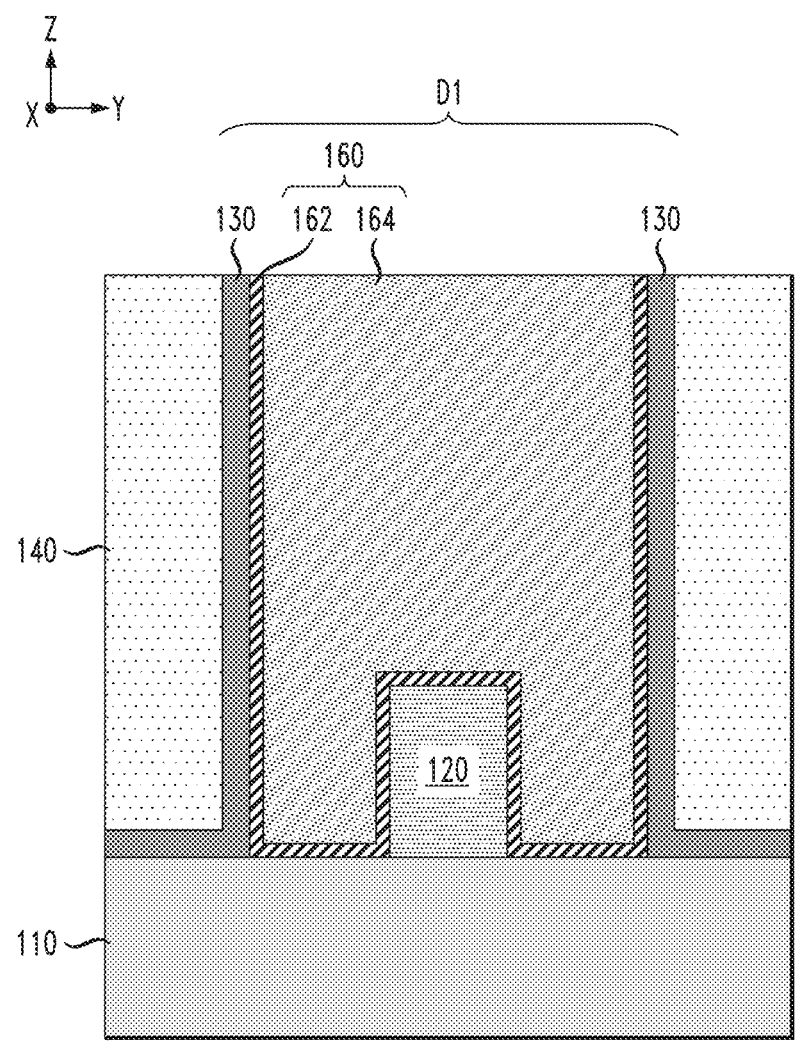

Following removal of the dummy gate layers 152 using a cyclic etch process as discussed above with reference to FIG. 3, metal gate structures are formed to replace the dummy gate structures G1 and G2. For example, FIGS. 4A and 4B are schematic views of the semiconductor device of FIGS. 2A and 2B, respectively, after removing the dummy gate oxide layers, and forming high-K metal gate structures 160 for the FinFET devices D1 and D2 to complete the replacement metal gate process, according to an embodiment of the invention. Each metal gate structure 160 comprises a gate dielectric layer 162 and a metal gate electrode layer 164. The metal gate structures 160 can be formed by depositing one or more conformal layers of gate dielectric material over the surface of the semiconductor structure, and depositing one or more layers of conductive material over the gate dielectric material. A planarization process (e.g., CMP) is performed to polish the surface of the semiconductor structure down to the ILD layer 140, thereby removing the overburden portions of the gate dielectric and conductive materials, resulting in the semiconductor structure shown in FIGS. 4A and 4B with metal gate structures 160.

The gate dielectric layers 162 are formed with any suitable dielectric material including, for example, nitride, oxynitride, or oxide or a high-k dielectric material having a dielectric constant of about 3.9 or greater. In particular, the conformal layer of gate dielectric material 162 can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The dielectric material that forms the gate dielectric layers 162 is deposited using known methods such as atomic layer deposition (ALD), for example, which allows for high conformality of the gate dielectric material.

The gate electrode layers 164 are formed with any suitable conductive material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal layer of gate dielectric material 162 prior to depositing the layer of conductive material 164. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layers 164 can serve as a WFM layer.

Following the formation of the metallic gate structures 160, any suitable sequence of processing steps can be implemented to complete the fabrication of n-type and/or p-type FinFET devices and other elements of a semiconductor integrated circuit being fabricated as part of the FEOL layer, the details of which are not needed to understand embodiments of the invention. Moreover, a MOL (middle of the line) process is performed to form conductive via contacts in the ILD layer 140 (and one or more other layers of insulating material that may be formed over the ILD layer 140). The via contacts are formed by etching openings in the ILD layer 140 (and any overlying insulating layer) down to the S/D regions of the vertical semiconductor fin 120, and to the metal gate structures 160, and then filling the openings with a conductive material to form the device contacts in the ILD layer 140. Following formation of the MOL device contacts, a BEOL (back end of line) interconnect structure is formed using well known fabrication process flows to provide connections between the FinFET devices and other active or passive devices that are formed as part of the FEOL layer.

It is to be understood that the methods discussed herein for etching oxide layers, such as dummy gate oxide layers, can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a semiconductor device, comprising:
   performing a cyclic etch process to incrementally etch an oxide layer, wherein the cyclic etch process comprises sequentially performing at least two instances of an etch cycle, wherein the etch cycle comprises:
      performing an etch process to partially etch a portion of the oxide layer using an etch chemistry and environment which is configured to etch down the oxide layer at an etch rate of about 25 angstroms/minute or less, wherein the etch chemistry and environment comprises a reaction pas and a carrier gas, wherein the reaction gas is flowed into a chamber for the etch process at a flow rate of about 30 sccm (standard cubic centimeter per minute) to about 50 sccm, and wherein the carrier gas is flowed into the chamber at a flow rate of about 100 sccm to about 1000 sccm, and wherein the chamber is maintained at a pressure of about 30 mTorr to about 50 mTorr; and
      performing a thermal treatment to remove by-products of the etch process.

2. The method of claim 1, wherein a ratio of the carrier gas to reaction gas is about 20:1 or greater.

3. The method of claim 1, wherein the reaction gas comprises hydrogen fluoride (HF) and wherein the carrier gas comprises Argon (Ar).

4. The method of claim 1, wherein the reaction gas comprises a mixture of hydrogen fluoride (HF) and ammonia ($NH_3$), and wherein the carrier gas comprises a mixture of Argon (Ar) nitrogen ($N_2$).

5. The method of claim 1, wherein performing a thermal treatment to remove by-products of the etch process comprises:
   maintaining a thermal anneal temperature within a chamber in range of about 150° C. to about 200° C.;
   flowing a thermal anneal gas into the chamber at a flow rate of about 1000 sccm to about 2000 sccm;
   maintaining a pressure within the chamber at a pressure of abut 1000 mTorr, and
   performing the thermal treatment for a period of time which is sufficient to evaporate the by-products of the etch process.

6. The method of claim 1, wherein the etch chemistry and environment is configured to etch the oxide layer selective to nitride material with an etch selectivity of no less than about 100:1.

7. The method of claim 1, wherein the etch chemistry and environment is configured to etch the oxide layer selective to epitaxial semiconductor material with an etch selectivity of no less than about 25:1.

8. The method of claim 1, wherein the etch chemistry and environment is configured to etch the oxide layer selective to dielectric material of an interlevel dielectric (ILD) layer with an etch selectivity of no less than about 2:1.

9. A method for fabricating a semiconductor device, comprising:
   forming a dummy gate structure over a portion of a vertical semiconductor fin of a FinFET (field effect transistor) device, wherein the dummy gate structure comprises a dummy gate oxide layer formed on vertical semiconductor fin, and a dummy gate electrode layer formed on the dummy gate oxide layer; and
   performing a RMG (replacement metal gate) process which comprises removing the dummy gate structure, and forming a metallic gate structure in place of the dummy gate structure;
   wherein removing the dummy gate structure comprises etching away the dummy gate electrode layer, and etching away the dummy gate oxide layer using a cyclic etch process to incrementally etch the dummy gate oxide layer, wherein the cyclic etch process comprises sequentially performing at least two instances of an etch cycle, wherein the etch cycle comprises:
      performing an etch process to partially etch a portion of the dummy gate oxide layer using an etch chemistry and environment which is configured to etch down the dummy gate oxide layer at an etch rate of about 25 angstroms/minute or less, wherein the etch chemistry and environment comprises a reaction gas and a carrier gas, wherein the reaction gas is flowed into a chamber for the etch process at a flow rate of about 30 sccm (standard cubic centimeter per minute) to about 50 sccm, and wherein the carrier gas is flowed into the chamber at a flow rate of about 100 sccm to about 1000 sccm, and wherein the chamber is maintained at a pressure of about 30 mTorr to about 50 mTorr; and performing a thermal treatment to remove by-products of the etch process.

10. The method of claim 9, wherein a ratio of the carrier gas to reaction gas is about 20:1 or greater.

11. The method of claim 9, wherein the reaction gas comprises hydrogen fluoride (HF) and wherein the carrier gas comprises Argon (Ar).

12. The method of claim 9, wherein the reaction gas comprises a mixture of hydrogen fluoride (HF) and ammonia ($NH_3$) and wherein the carrier gas comprises a mixture of Argon (Ar) nitrogen ($N_2$).

13. The method of claim 9, wherein performing a thermal treatment to remove by-products of the etch process comprises:

maintaining a thermal anneal temperature within a chamber in range of about 150° C. to about 200° C.;

flowing a thermal anneal gas into the chamber at a flow rate of about 1000 sccm to about 2000 sccm;

maintaining a pressure within the chamber at a pressure of about 1000 mTorr; and performing the thermal treatment for a period of time which is sufficient to evaporate the by-products of the etch process.

14. The method of claim 9, wherein the etch chemistry and environment is configured to etch the oxide layer selective to nitride material with an etch selectivity of no less than about 100:1.

15. The method of claim 9, wherein the etch chemistry and environment is configured to etch the dummy gate oxide layer selective to epitaxial semiconductor material of the vertical semiconductor fin with an etch selectivity of no less than about 25:1.

16. The method of claim 9, wherein the etch chemistry and environment is configured to etch the dummy gate oxide layer selective to dielectric material of an interlevel dielectric (ILD) layer with an etch selectivity of no less than about 2:1.

* * * * *